United States Patent
Jungnickel et al.

(10) Patent No.: US 7,829,453 B2
(45) Date of Patent: Nov. 9, 2010

(54) METHOD FOR FORMING SOLDER BALLS WITH A STABLE OXIDE LAYER BY CONTROLLING THE REFLOW AMBIENT

(75) Inventors: Gotthard Jungnickel, Radeberg (DE); Alexander Platz, Moritzburg (DE); Frank Kuechenmeister, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 736 days.

(21) Appl. No.: 11/531,437

(22) Filed: Sep. 13, 2006

(65) Prior Publication Data

US 2007/0123020 A1    May 31, 2007

(30) Foreign Application Priority Data

Nov. 30, 2005  (DE) ............... 10 2005 057 058
Jan. 10, 2006  (DE) ............... 10 2006 001 254

(51) Int. Cl.
*H01L 21/44* (2006.01)
(52) U.S. Cl. ...................... 438/615; 438/612

(58) Field of Classification Search ............ None
See application file for complete search history.

(56) References Cited

U.S. PATENT DOCUMENTS

| 5,137,845 | A | * | 8/1992 | Lochon et al. | ............ 438/614 |
| 6,179,198 | B1 | | 1/2001 | Eifuku et al. | |
| 6,219,910 | B1 | | 4/2001 | Murali | ............ 29/840 |
| 6,336,262 | B1 | * | 1/2002 | Dalal et al. | ............ 29/25.42 |

FOREIGN PATENT DOCUMENTS

GB      2 368 629 A    5/2002

* cited by examiner

*Primary Examiner*—Zandra Smith
*Assistant Examiner*—Pamela E Perkins
(74) *Attorney, Agent, or Firm*—Williams, Morgan & Amerson, P.C.

(57) ABSTRACT

By controlling the cooling rate during the oxidation process for forming an oxide layer on solder balls and by selecting an elevated temperature as an initial temperature of the oxidation process, a reliable yet easily removable oxide layer may be obtained. Consequently, yield losses during the flip chip assembly process may be significantly reduced.

24 Claims, 3 Drawing Sheets

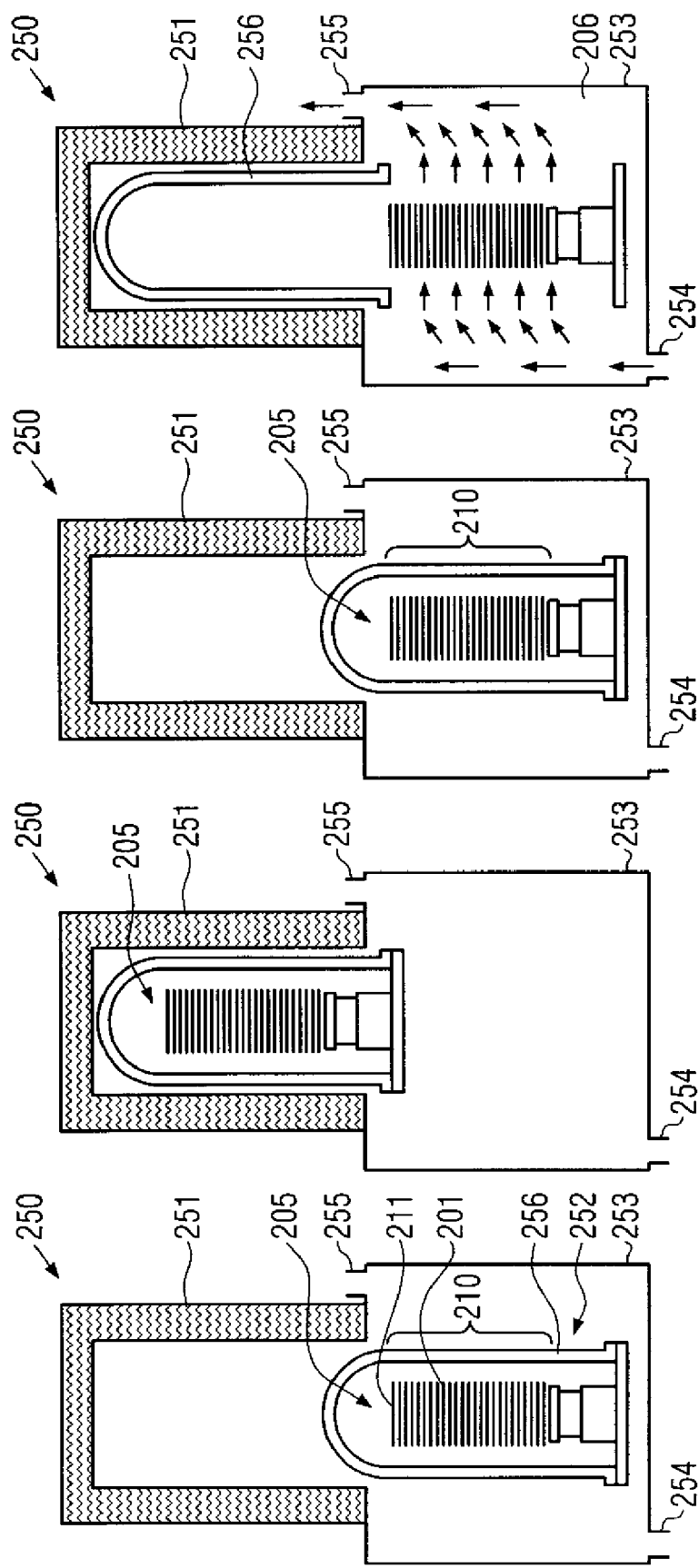

METHOD FOR FORMING SOLDER BALLS WITH A STABLE OXIDE LAYER BY CONTROLLING THE REFLOW AMBIENT

BACKGROUND OF THE INVENTION

1. Field of the Invention

The present invention relates to a process flow for forming a solder layer including contact balls of a contact material, such as solder, for providing contact areas for directly attaching an appropriately formed package or carrier substrate to a die carrying an integrated circuit.

2. Description of the Related Art

In manufacturing integrated circuits, it is usually necessary to package a chip and provide leads and terminals for connecting the chip circuitry with the periphery. In some packaging techniques, chips, chip packages or other appropriate units may be connected by means of balls of solder or any other conductive material, formed from so-called solder bumps, that are formed on a corresponding layer, which will be referred to herein as a solder layer, of at least one of the units, for instance on a dielectric passivation layer of the microelectronic chip. In order to connect the microelectronic chip with the corresponding carrier, the surfaces of the two respective units to be connected, i.e., a microelectronic chip comprising, for instance, a plurality of integrated circuits and a corresponding package, have formed thereon adequate pad arrangements to electrically connect the two units after reflowing the solder balls provided at least on one of the units, for instance on the microelectronic chip. In other techniques, solder balls may have to be formed that are to be connected to corresponding wires, or the solder balls may be brought into contact with corresponding pad areas of another substrate acting as a heat sink. Consequently, it may be necessary to form a large number of solder balls that may be distributed over the entire chip area, thereby providing, for example, the I/O capability required for modern microelectronic chips that usually include complex circuitry, such as microprocessors, storage circuits and the like and/or include a plurality of integrated circuits forming a complete complex circuit system.

In order to provide hundreds or thousands of mechanically well-fastened solder balls on corresponding pads, the attachment procedure of the solder balls requires a careful design, since the entire device may be rendered useless upon failure of only one of the solder balls. For this reason, one or more carefully chosen layers are generally placed between the solder balls or the bumps, from which the solder balls are formed by reflowing, and the underlying substrate or wafer including the pad arrangement. In addition to the important role these interfacial layers, herein also referred to as underbump metallization layer, may play in endowing a sufficient mechanical adhesion of the bump to the underlying pad and the surrounding passivation material, the underbump metallization has to meet further requirements with respect to diffusion characteristics and current conductivity. Regarding the former issue, the underbump metallization layers have to provide an adequate diffusion barrier to prevent the solder material or bump material, frequently a mixture of lead (Pb) and tin (Sn), from attacking the chip's underlying metallization layers and thereby destroying or negatively affecting their functionality. Moreover, migration of bump material, such as lead, to other sensitive device areas, for instance into the dielectric, where a radioactive decay in the lead may also significantly affect the device performance, has to be effectively suppressed by the underbump metallization. Regarding current conductivity, the underbump metallization, which serves as an interconnect between the solder ball and the underlying metallization layer of the chip, has to exhibit a thickness and a specific resistance that does not inappropriately increase the overall resistance of the metallization pad/ball system. In addition, the underbump metallization will serve as a current distribution layer during electroplating of the bump material. Electroplating is presently the preferred deposition technique for solder material, since physical vapor deposition of solder bump material, which is also used in the art, requires a complex mask technology in order to avoid any misalignments due to thermal expansion of the mask while it is contacted by the hot metal vapors. Moreover, it is extremely difficult to remove the metal mask after completion of the deposition process without damaging the solder pads, particularly when large wafers are processed or the pitch between adjacent solder pads is small.

Although a mask is also used in the electroplating deposition method, this technique differs from the evaporation method in that the mask is created using photolithography to thereby avoid the above-identified problems caused by physical vapor deposition techniques. However, electroplating requires a continuous and highly uniform current distribution layer adhered to the substrate that is mainly insulative, except for the pads on which the bumps will be formed. Thus, the underbump metallization also has to meet strictly set constraints with respect to a uniform current distribution as any non-uniformities during the plating process may affect the final configuration of the bumps and, after reflowing, the bumps of the resulting solder balls in terms of, for instance, height non-uniformities, which may in turn translate into fluctuations of the finally obtained electric connections and the mechanical integrity thereof. The height of the bumps is, among others, determined by the local deposition rate during the electroplating process, which is per se a highly complex process, so that process non-uniformities resulting from irregularities of the plating tool or any components thereof may also directly cause corresponding non-uniformities during the final assembly process. The underbump metallization layer is patterned by means of appropriate etch techniques to provide well-defined islands below the solder material, thereby providing a well-defined wetting layer for the subsequent reflow process during which the solder bumps are shaped into spheres or balls. The size and thus the height of these solder balls is critical for the actual attachment of the chip to the carrier substrate, since any height variations may lead to a reduced contact in the final reflow process for connecting to the respective solder pad of the carrier substrate.

During reflowing, the solder material for forming the solder balls, especially any tin contained therein, may form an intermetallic phase with the copper of the uppermost sublayer of the underbump metallization layer, thereby creating a reliable metallization interface. Moreover, during the reflow process, an oxide layer comprised of lead and tin forms on the surface of the solder ball and imparts a shiny appearance to the solder ball. The oxide layer acts as a passivation layer during subsequent manufacturing processes, such as substrate dicing and the like, wherein the integrity of the solder balls is to be maintained so as to substantially avoid any additional non-uniformities of the solder balls. Thus, the oxide layer desirably exhibits a high stability during the further assembling process, yet should be readily removable by a flux material prior to the final solder process for attachment to the carrier substrate. During the removal of the oxide layer, however, non-removed residuals of the oxide may significantly affect the solder process, thereby possibly causing a non-wet contact with the solder pad of the carrier substrate. Hence, a less reliable connection or a total failure of the connection may result. As previously explained, great efforts are made for improving the complex process related to the formation of the underbump metallization layer and the solder bumps; however, non-uniformities encountered during the reflow process may be of comparable importance.

In view of the above-described situation, a need exists for an enhanced technique that may avoid or at least reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that addresses uniformity issues of the reflow process that may be caused by the oxide passivation layer by enabling the formation of a reliable oxide layer on a surface area of solder balls, which has an enhanced stability, while a thickness and a uniformity thereof is improved so as to be readily and efficiently removed prior to and during the solder process for attaching a solder pad to respective solder balls. According to the present invention, the enhanced stability and uniformity of the corresponding tin and lead oxide-containing cover layer of the respective solder balls may be accomplished by appropriately controlling the temperature at which the oxidation process is initiated and/or the cooling rate during the formation of the oxide layer in an oxidizing ambient after the reflow process for rounding the initial solder bumps is completed.

According to one illustrative embodiment of the present invention, a method comprises forming a plurality of lead and tin-containing solder bumps above the substrate and forming solder balls by reflowing the plurality of solder bumps in an inert ambient comprising at least one of hydrogen and a hydrogen/nitrogen mixture by heating the solder bumps above the melting temperature above the solder bumps. Moreover, the method comprises exposing the solder balls to ambient air when a temperature of the substrate is less than approximately 250° C. and higher than approximately 190° C.

According to another illustrative embodiment of the present invention, a method comprises forming a plurality of lead and tin-containing solder bumps above a substrate and forming solder balls by reflowing the plurality of solder bumps in an inert ambient comprising at least one of hydrogen and a hydrogen/nitrogen mixture by heating the solder bumps above the melting temperature of the solder bumps. Moreover, the solder balls are exposed to ambient air while a cooling rate of the substrate is controlled to be within a range of approximately 10-25° C. per minute.

According to yet another illustrative embodiment of the present invention, a method comprises forming a plurality of solder bumps above a substrate and forming solder balls by reflowing the plurality of solder bumps in an inert ambient comprising at least one of hydrogen and a hydrogen/nitrogen mixture by heating the solder bumps above the melting temperature of the solder bumps. Moreover, the solder balls are exposed to an oxidizing ambient when a temperature of the substrate is less than approximately 250° C. while a cooling rate of the substrate is controlled to be in the range of approximately 10-25° C. per minute.

BRIEF DESCRIPTION OF THE DRAWINGS

The invention may be understood by reference to the following description taken in conjunction with the accompanying drawings, in which like reference numerals identify like elements, and in which:

FIGS. 2a-2d schematically show a plurality of vertically arranged substrates during a process flow for forming rounded solder balls having formed thereon a reliable and thin oxide layer in accordance with still other illustrative embodiments of the present invention.

Figure 1A:
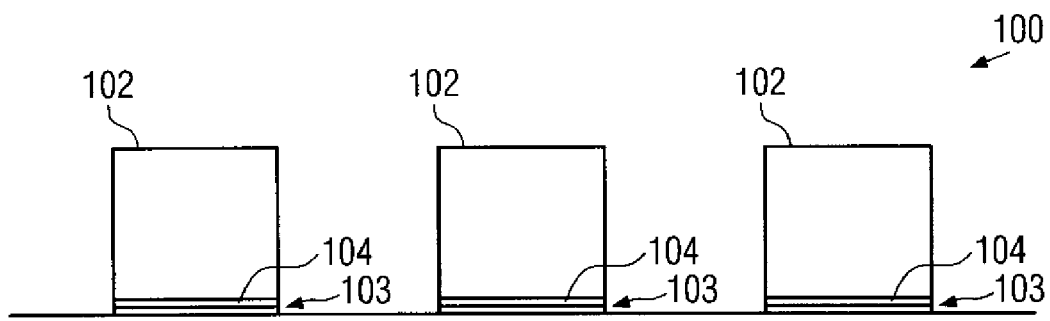
FIGS. 1a-1c schematically show cross-sectional views of a semiconductor device having formed therein solder bumps (FIG. 1a), which are reflowed (FIG. 1b) in order to form rounded solder balls with a subsequent formation of a reliable and thin oxide layer (FIG. 1c) in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention may address and consider the influence of the passivation layer of solder balls with respect to the packaging process and thus relates to a manufacturing sequence for forming a reliable yet readily removable oxide layer on solder balls that is to be formed in order to maintain the integrity of the solder balls during the further manufacturing processes while allowing an efficient removal of the oxide layer prior to or during the solder process for connecting the solder balls with respective solder pads of a carrier substrate. For this purpose, the actual reflow process, in which the previously formed solder bumps are heated above the melting temperature of the solder material, is performed in a substantially inert ambient that is established on the basis of hydrogen or formic gas, i.e., a gas containing a mixture of hydrogen and nitrogen. In this respect, it should be noted that an inert ambient comprised of hydrogen or a formic gas is to be understood as an atmosphere with a specified pressure, wherein the main component is represented by hydrogen or the formic gas, while nevertheless traces of other gases and substances may be present within the inert ambient due to typical tool contaminations and other imperfections of the corresponding equipment. Moreover, although a chemical reaction of the inert ambient with exposed surface materials of the substrate to be treated is negligible, minute amounts of foreign materials or gases and particles may still be liberated into the inert ambient and may even be present in measurable amounts. Consequently, the term "inert ambient" as used herein and in the appended claims should be understood in the above-defined sense, wherein, for instance, an amount of less than approximately 1 volume % or less than approximately 0.1 volume % of non-inert gas with respect to the hydrogen or formic gas may be considered as an inert ambient containing hydrogen and/or a hydrogen/nitrogen mixture according to the present invention. Moreover, according to the principles of the present invention, contacting the reflowed solder bumps with an oxidizing ambient, which in some illustrative embodiments is represented by ambient air, is performed at elevated temperatures up to approximately 250° C., thereby achieving a highly uniform and well controllable oxidation of exposed surface portions of the solder balls. Additionally or alternatively, in some illustrative embodiments, after reflowing the solder bumps, the subsequently performed cooling of the substrate and thus of the solder balls is controlled so as to maintain a cooling rate within a range of approximately 25° C. per minute and 10° C. per minute, while the solder balls are exposed to the oxidizing ambient, such as ambient air. Consequently, based on an elevated oxidation temperature and/or a corresponding control of the cooling rate, a thin yet highly reliable and uniform oxidation layer for lead- and tin-based solder balls may be formed.

With respect to FIGS. 1a-1e and 2a-2d, further illustrative embodiments of the present invention will now be described in more detail. FIG. 1a schematically shows a semiconductor device 100 comprising a substrate 101, above which a plurality of solder bumps 102 is formed. The substrate 101 may represent any type of substrate that is appropriate for forming circuit elements of integrated circuits thereon. For example, the substrate 101 may represent a bulk silicon substrate having formed thereon an appropriate silicon-based semiconductor layer, or the substrate 101 may represent a silicon-on-insulator (SOI) substrate including a buried insulating layer, above which may be formed a silicon-based crystalline semiconductor layer. In other illustrative embodiments, the substrate 101 may represent any appropriate carrier material for a crystalline or amorphous semiconductor material that is suitable for the formation of circuit elements, such as transistors, capacitors, resistors and the like. For convenience, any such circuit elements are not shown in the figures. It should further be appreciated that the substrate 101 may also comprise one or more "wiring" layers that provide the electrical connection of respective circuit elements and which also provide the electrical connection to at least some of the plurality of solder bumps 102. Again, respective wiring layers or metallization layers are not shown in FIG. 1a. The plurality of solder bumps 102 comprising, for example, lead and tin in an appropriate ratio are formed on respective underbump metallization layers 103, which may in turn be comprised of a plurality of sub-layers in order to provide the required thermal, mechanical and electrical characteristics, as is previously explained. In one illustrative embodiment, an uppermost layer 104 of the underbump metallization layer 103 may be comprised of copper or a copper alloy, which may form a stable connection with the tin contained in the solder bumps 102 during the reflow process that is to be formed subsequently. The materials and techniques used in forming such metallization layers 103 are well known to those skilled in the art and, thus, will not be discussed further so as not to obscure the present invention. The dimensions and the pitch between neighboring solder bumps 102 is substantially determined by device requirements, wherein, in sophisticated applications, a lateral dimension of the solder bumps 102 may range from several micrometers to several hundred micrometers and more, while the pitch between neighboring solder bumps 102 may be approximately 100 μm and less or even 75 μm and less.

A typical process flow for forming the semiconductor device 100 as shown in FIG. 1a comprises essentially the same processes as previously described. That is, after the formation of any circuit elements and corresponding wiring layers including respective contact pads (not shown) within an appropriate passivation layer (not shown), the underbump metallization layer 103 may be formed above the substrate 101 and subsequently the solder bumps 102 may be formed by any appropriate deposition technique, for instance on the basis of electroplating techniques, during which an appropriately patterned resist mask may be used to form corresponding islands of solder material representing the solder bumps 102. Thereafter, the resist mask may be removed and the underbump metallization material may be patterned, thereby leaving behind the underbump metallization layer(s) 103.

Figure 1B:
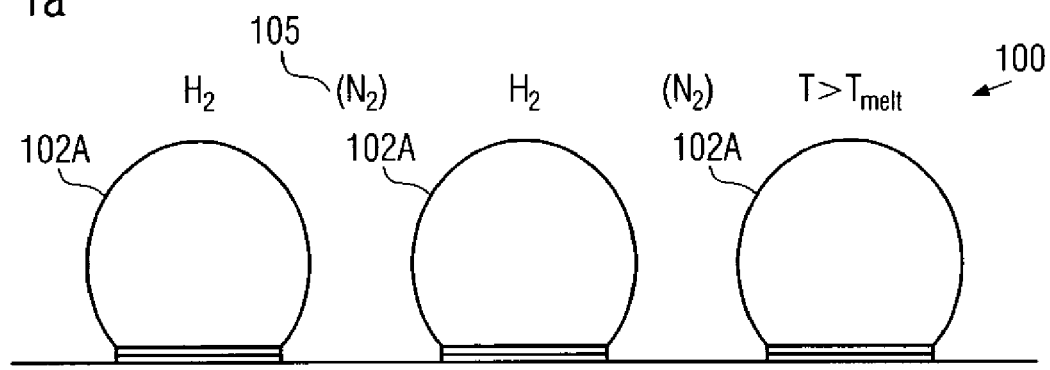

FIG. 1b schematically shows the semiconductor device 100 in a further advanced manufacturing stage. The semiconductor device 100 is exposed to an inert ambient 105, which, in one illustrative embodiment, may be comprised of a hydrogen ambient, while, in other illustrative embodiments, a formic gas, i.e., a mixture of hydrogen and nitrogen gas, may be used in establishing the inert ambient 105. In one illustrative embodiment, the "quality" of the inert ambient 105 is monitored and/or controlled at least with respect to the presence of traces of oxygen. In one illustrative embodiment, establishing a temperature in the substrate 101 and thus in the solder bumps 102 at or above the melting temperature of the solder bumps 102 may be performed with an oxygen content of approximately 10 parts per million (ppm) or less. For example, prior to establishing the inert ambient 105 on the basis of hydrogen or formic gas, the substrate 101 may be purged on the basis of pure nitrogen to remove or at least significantly reduce any contaminations, in particular oxygen, from the ambient surrounding the substrate 101. If a corresponding measurement value still indicates an unwanted high oxygen content, a further purge step may be performed until the desired low threshold is achieved. Thereafter, the inert ambient 105 may be established, while still in some embodiments the oxygen contents may be monitored. For instance, upon establishing the inert ambient 105, the substrate 101 may be purged with hydrogen or formic gas, with which the inert ambient 105 is to be established and the corresponding high flow rate may be used to continuously remove any contaminants that may still be within the inert ambient 105 or which may be produced during the subsequent heating of the substrate 101. Appropriate flow rates for hydrogen and/or the formic gas may depend on the specifics of the process tool used, such as a vertical reflow oven, a horizontal reflow oven or a single substrate reflow chamber and the like, and may thus be readily established on the basis of the teachings provided herein by means of test runs using the available equipment. Thereafter, an appropriate temperature may be established within the inert ambient 105 that is above the melting temperature of the material of the solder bumps 102. The melting temperature, which may range from approximately 200-320° C. may depend on the material composition, for instance on the ratio of lead and tin, and may be determined in advance so that the temperature within the inert ambient 105 may be controlled to an appropriately selected value above the respective melting temperature.

It should be appreciated that heating the substrate 101 and thus the solder bumps 102 may be performed in several steps, which may, in some illustrative embodiments, be performed in different process chambers, as long as it is ensured that the oxygen contents may be maintained below the desired threshold value. In still other embodiments, the temperature within the inert ambient 105 may be raised in accordance with a specified time schedule in situ, wherein a substantially uniform temperature distribution across the substrate 101 and across different substrates, when a plurality of substrates are to be processed simultaneously within the ambient 105, is achieved. After crossing the melting temperature, the solder bumps 102 are increasingly reflowed and may be substantially rounded, wherein the finally obtained dimensions are substantially determined by the dimensions of the solder bumps 102 and the underlying layer 104, which is substantially completely wetted during the reflow process, while the surface tension of the solder material may result in a substantially spherical shape, except for the bottom that is in contact with the layer 104, thereby forming respective solder balls 102A. In order to avoid unduly extended time periods in which the solder is maintained in its melted state, the temperature during the final phase of the reflow process may be maintained well above the melting temperature and may be as high as approximately 360° C. for a melting temperature of approximately 320° C. In other cases, a reduced process temperature of, for example, 250-260° C. may be used in combination with a reduced melting temperature of a corresponding material composition of the solder bumps 102. After a specified time period of applying the process temperature above the melting temperature for reflowing the solder bumps 102, the process temperature may be reduced, thereby allowing the substrate 101 and thus the solder balls 102A to cool down wherein, depending on the previously used temperature, the solder balls 102A may be brought into contact with an oxidizing ambient at a temperature as high as 250° C. and less, wherein, in some illustrated embodiments, a minimum temperature for exposing the solder balls 102A may be selected to be approximately 190° C.

Figure 1C:
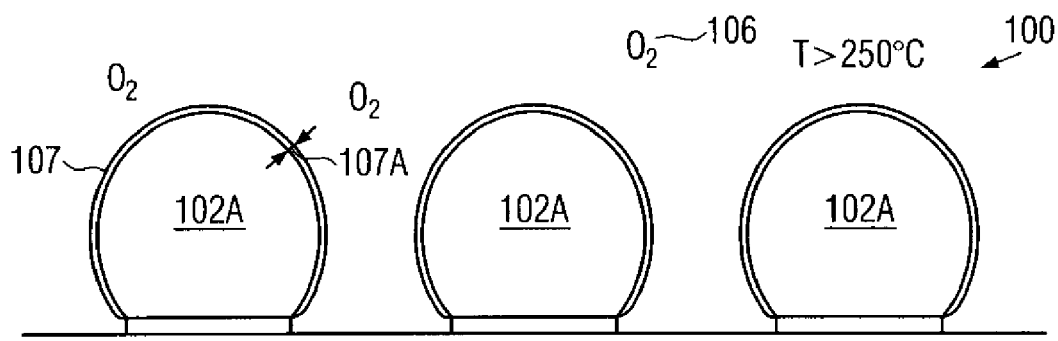

FIG. 1c schematically shows the semiconductor device 100 exposed to an oxidizing ambient 106, wherein a temperature of the substrate 101 and thus of the solder balls 102A is 250° C. and less. Without intending to restrict the present application to the following explanation, it is believed that the elevated temperature at the beginning of the exposure to the oxidizing ambient 106 may enhance the controllability and thus the uniformity of the starting oxidation process, during which tin oxide and lead oxide are formed on surface portions of the solder balls 102A, thereby forming an oxide layer 107. In one illustrative embodiment, the oxidizing ambient 106 is established on the basis of oxygen and an inert gas, such as nitrogen, argon and the like, wherein approximately 5-25 volume % oxygen may be provided in the ambient 106. In still other illustrative embodiments, the oxidizing ambient 106 may be established on the basis of ambient air, wherein it should be appreciated that the term "ambient air" is to be understood as an ambient air as is typically provided in clean rooms for the fabrication of semiconductor devices, and hence the ambient air may be considered as a gas mixture including approximately 20% oxygen and 79% nitrogen with traces of other gases, such as noble gases and the like. During exposure to the oxidizing ambient 106, the substrate 101 and thus the solder balls 102A may be allowed to further cool down, thereby increasingly reducing the reaction speed of the oxidation process. The interval from establishing the oxidizing ambient 106 and when the substrate 101 reaches a predetermined "end" temperature may be considered as a controlled portion of the entire cooling period, wherein the entire cooling period may be considered as being finished when the substrate 101 reaches the ambient temperature. In one embodiment, the end temperature of the portion in which substrate handling and other processes are substantially avoided is approximately 50° C. In one illustrative embodiment, the cooling rate of the substrate 101 during this controlled portion is controlled to be within a range of approximately 10° C. per minute to approximately 25° C. per minute. By restricting the cooling rate to the above-specified value range, the uniformity of the ongoing oxidation process and thus of the resulting oxide layer 107 may be enhanced so that with a reduced final thickness nevertheless a high stability may be achieved, wherein the reduced thickness and yet enhanced uniformity enables a reliable removal of the oxide layer 107 in a later stage during the connection to a solder pad of a carrier substrate. For example, for a lead-rich lead/tin alloy and with a starting temperature for the oxidizing ambient 106 of approximately 250° C., a highly uniform layer thickness for the oxide layer 107 may be obtained of approximately 10 nm and significantly less.

Figure 1D:
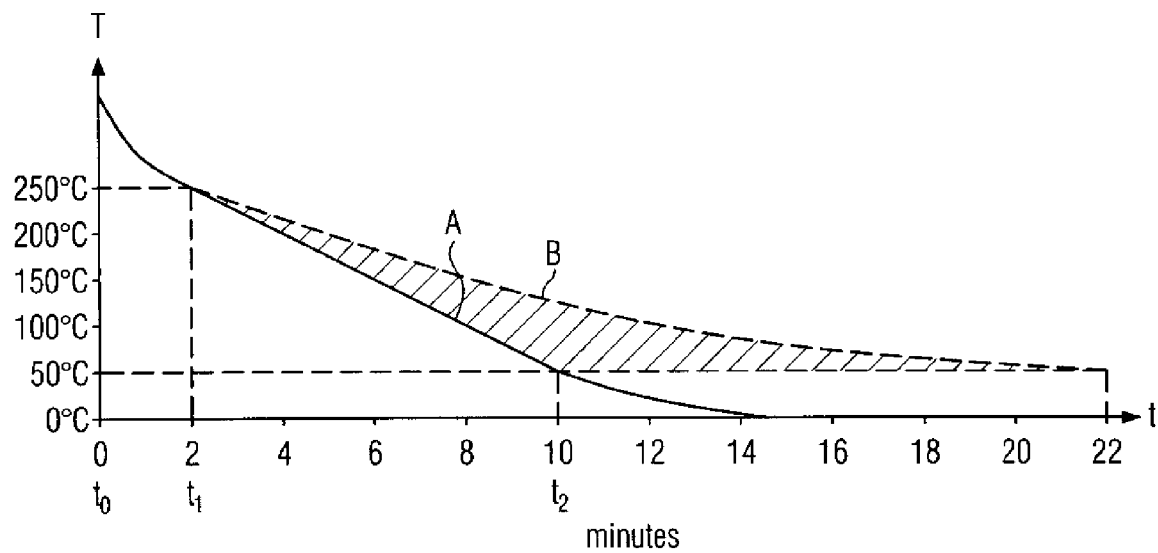
FIG. 1d schematically illustrates a graph depicting a cooling rate during the oxidation of solder balls in accordance with illustrative embodiments of the present invention.

FIG. 1d schematically shows an appropriate range for values of the cooling rate according to some illustrative embodiments of the present invention. In FIG. 1d, the vertical axis represents the temperature of the substrate 101, which may essentially be the same as the temperature of the solder balls 102A, and the horizontal axis represents the time in minutes after the substrate 101 is initially allowed to cool down. In FIG. 1d, the solid line A may represent a cooling rate of approximately 25° C. per minute so that, when starting from an initial temperature of 250° C., which may be achieved for instance at the point of time $t_1$, a temperature of approximately 50° C. may be achieved at a point of time $t_2$, wherein the interval $t_1$, $t_2$ corresponds to approximately eight minutes. During the time interval starting at $t_0$, which may be assumed to represent a point in time of the reflowing of the solder bumps 102 within the inert ambient 105, wherein the substrate 101 may then be allowed to further cool down, while the inert ambient 105 is still maintained, to the point $t_1$, the oxidizing ambient 106 may be established to initiate the oxidation process for forming the oxide layer 107, wherein an enhanced uniformity and a desirable thickness may be achieved, as long as the maximum cooling rate represented by the solid line is not exceeded. Similarly, the dashed line B in FIG. 1d may represent a corresponding minimum cooling rate according to the above-specified range, consequently the dashed line B may represent a cooling rate of approximately 10° C. per minute, wherein an enhanced uniformity and an acceptable thickness for the oxide layer 107 may still be obtained when the cooling rate is maintained at or below the dashed line B. That is, the hatched area enclosed by the solid A and dashed B lines may represent a range of allowable cooling rates during the exposure to the oxidizing ambient 106 according to some illustrative embodiments of the present invention. Thus, the controlled portion of the cooling period, defined in this embodiment by the temperatures of approximately 250° C. and approximately 50° C., may therefore comprise a cooling rate in the hatched area.

As previously explained, in some embodiments, the oxidizing ambient 106 may be represented by ambient air of a clean room, wherein, for example, the corresponding cooling rate may depend on the flow rate with which the ambient air is supplied to the substrate 101, wherein it is to be appreciated that a typical ambient temperature is in the range of approximately 20-25° C. Thus, the cooling rate may be efficiently controlled on the basis of the flow rate of ambient air supplied to the substrate 101. In other embodiments, the temperature of the ambient air may be adjusted to any appropriate value, prior to being supplied to the substrate 101, to provide a further mechanism, in addition or alternatively, to controlling the flow rate for maintaining the cooling rate within the above-specified value range. In still other illustrative embodiments, the temperature of the substrate 101 may be additionally controlled on the basis of an appropriate substrate holder including an appropriate heater/cooler unit and the like.

In some illustrative embodiments, the substrate 101 may be released with respect to a further handling or manufacturing process when the temperature thereof is at approximately 50° C. or less. Consequently, by maintaining the oxidizing ambient 106 with high uniformity down to temperatures of approximately 50° C., the corresponding oxidation process, although significantly slowed down at these low temperatures, may nevertheless process in a highly uniform fashion, therefore also contributing to the overall uniformity of the oxide layer 107.

As previously explained, the melting temperature and thus the actual process temperature during reflowing of the solder bumps 102 and the formation of the rounded solder balls 102A may depend on the material composition of the solder material and may therefore vary from approximately 200-320° C. for a lead/tin alloy of varying ratio. Consequently, the corresponding temperature for initiating the oxidizing ambient 106, which is shown in FIG. 1d to substantially correspond to approximately 250° C., may be selected in accordance with the respective melting temperature and thus the previously used process temperature, as typically a reduced process temperature may be used during the reflow process with a reduced melting temperature. Consequently, a lower temperature, for instance ranging down to approximately 190° C., may be selected for initiating the oxidizing ambient 106, wherein, in some illustrative embodiments, the same value ranges for the cooling rate may be used as are specified by the hatched area in FIG. 1d.

It should also be appreciated that in some illustrative embodiments the transition phase between the inert ambient 105 and the oxidizing ambient 106 may comprise appropriate purging steps for the establishment of an appropriate gas ambient, such as a nitrogen ambient, which may then be maintained until the desired temperature for establishing the oxidizing ambient 106 is achieved.

Figure 1E:
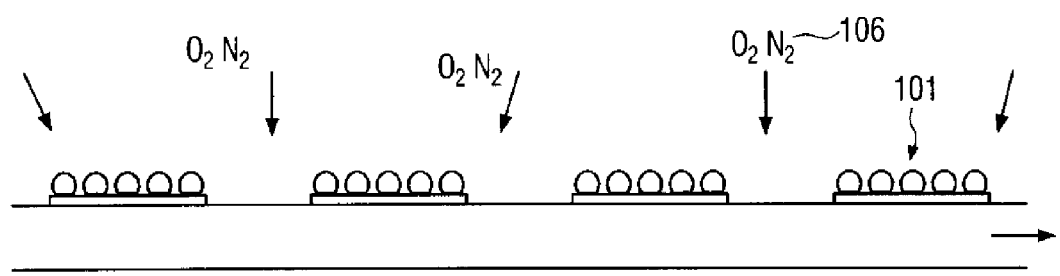
FIG. 1e schematically shows a plurality of substrates arranged in a substantially horizontal manner so as to simultaneously process a plurality of substrates according to illustrative embodiments.

FIG. 1e schematically shows a plurality of substrates 101 that are simultaneously subjected to the oxidizing ambient 106, wherein the plurality of substrates 101 are arranged in a substantially horizontal configuration. For instance, the plurality of substrates 101 may be moved through the oxidizing ambient 106, wherein, for instance, the oxidizing ambient 106 may represent ambient air substantially comprised of oxygen and nitrogen. For example, commercially available reflow ovens including a belt furnace may be used, wherein corresponding process parameters with respect to the initial temperature of supplying the oxidizing ambient 106 and the control of the cooling rate may be adjusted as specified above.

With reference to FIGS. 2a-2c, further illustrative embodiments of the present invention will now be described in more detail, wherein a plurality of substrates 201 including respective solder bumps, such as the substrates 101, are processed in a common process sequence using a substantially vertical arrangement of the plurality of substrates.

FIG. 2a schematically illustrates a system 250 that is appropriate to reflow solder bumps and form a uniform and thin oxide layer on the resulting solder balls. The system 250, which may represent a vertical reflow oven, comprises a furnace 251 and a chamber 253 for establishing an appropriate oxidizing ambient, similar to the ambient 106 previously described with reference to FIG. 1d. Moreover, a container 252 comprising a removable cap 256 may be provided that is appropriate for receiving a plurality of substrates 201, wherein each of the substrates 201 may have formed thereon respective solder bumps, such as the solder bumps 102, that are to be converted into respective solder balls. The container 252 is configured to receive the plurality of substrates 201 in a substantially vertical arrangement, thereby forming a vertical stack 210, wherein respective spaces are provided between adjacent substrates 201. For example, the container 252 may be configured to receive a predefined number of substrates, such as 50 substrates, or any other appropriate number. The container 252 may further be configured to enable generation of an appropriate inert ambient that may be applied during reflowing the individual solder bumps formed on each of the substrates 201. Thus, corresponding supply lines and mechanisms for supplying an appropriate gas into the container 252 and discharge gas therefrom may be provided, which are not shown in FIG. 2a for the sake of clarity.

During operation of the system 250, the plurality of substrates 201 may be loaded into the container 252, wherein, in some illustrative embodiments, the container 252 is loaded with the predefined number of substrates for enhancing the process uniformity between different pluralities of substrates that are subsequently processed in the system 250. For example, using the same number of substrates for each subsequent process run in the system 250 may substantially generate the same process conditions for each plurality with respect to flow rates used for establishing gaseous ambients and in view of heat transfer by radiation, convection and the like. Consequently, if the plurality of substrates 201 is less in number with respect to the desired predefined number of substrates, an appropriate number of place holder substrates may by incorporated into the stack 210 in order to obtain the predefined number of substrates. Moreover, the process uniformity within each stack 210 may be enhanced in that respective place holder substrates may be positioned at specified locations at which a process non-uniformity may be expected. For example, the very first substrate, indicated as 211, may experience a difference in gas flow, heat transfer and the like, due to the absence of one next neighbor compared to other substrates within the stack 210. Consequently, the substrate 211 may represent a place holder substrate which may therefore enhance the process uniformity for its subsequent neighbor, which may then represent a regular substrate 201 including solder bumps to be reflowed. After loading the plurality of substrates 201, possibly on the basis of the predefined number and including one or more place holder substrates, an appropriate ambient may be established within the container 252, for instance on the basis of nitrogen, for purging the container 252 by selecting an appropriate flow rate of nitrogen. Thereafter, the resulting ambient may be tested with respect to the presence of oxygen and possible other contaminants, wherein, in one illustrative embodiment, the process may be controlled such that the oxygen content is approximately 10 ppm and less. For this purpose, the container 252 may be purged with nitrogen until the oxygen content is below the specified threshold. Thereafter, the container 252 may be supplied with hydrogen or a formic gas, i.e., a mixture of hydrogen and nitrogen, wherein a high flow rate of the respective gases in an initial phase may additionally provide for the removal of any undesired contaminants, such as oxygen. Thereafter, a stable flow rate of hydrogen or formic gas may be established, thereby defining an inert ambient 205 for the plurality of substrates 201.

FIG. 2b schematically shows the system 250 in a configuration in which the container 252 is lifted to a position so as to locate the stack 210 within the furnace 251, thereby heating the substrates 201 above the melting temperature of the corresponding solder material. It should be appreciated that the system 250 may comprise a plurality of furnaces 251, each of which may be adjusted to a different temperature, wherein, for example, the container 252 may be introduced sequentially in two or more furnaces 251 so as to heat the substrates 201 in accordance with a specified temperature profile provided by the sequence of furnaces 251. In other embodiments, the substrates 201 may be heated within a single furnace 251, wherein, depending on process specifics, the heating rate may be controlled by correspondingly adjusting the temperature of the furnace 251 in a time dependent manner. Providing a specified temperature profile, for instance by a plurality of furnaces 251 or by operating a single furnace 251 in accordance with a specific time schedule, may provide enhanced process uniformity, since, for example, the substrate 201 may be heated below the melting temperature and may be maintained at this temperature for a specified time period, thereby ensuring that substantially each of the substrates 201 has the same temperature.

Thereafter, the substrates may be heated above the melting temperature in one or more steps, wherein the resulting temperature difference is less pronounced, thereby providing a highly uniform heating process of the substrates 201. In other illustrative embodiments, the heating of the substrates may be performed in a single step with a substantially constant temperature in the furnace 251.

Thereafter, the container 252 may be removed from the furnace 251 after a specified time interval, during which rounded solder balls, such as the solder balls 102A, have formed. Consequently, the substrates 201 may be allowed to cool down, wherein, in this phase, the inert ambient 205 may still be maintained or, in some embodiments, the interior of the container 252 may be purged with an appropriate gas, such as nitrogen. It should be appreciated that, in this stage, substantially no oxidation of the heated solder balls, which may still be in a liquid condition, may take place due to the absence of oxygen, except for minute amounts. After a predefined temperature of approximately 250° C. and less is reached, an oxidizing ambient may be established to initiate the formation of an oxide layer, as is also previously explained with reference to FIG. 1c.

FIG. 2d schematically shows the substrate 201 exposed to an oxidizing ambient 206, which, in one illustrative embodiment, may be established on the basis of ambient air introduced into the chamber 253 at the inlet 254 and discharged from the chamber 253 at the outlet 255. The substrates 201 may be exposed to the oxidizing ambient 206 by simply removing the removable cap 256 of the container 252. As previously explained, by controlling the flow rate and/or the temperature of the oxygen-containing gas for establishing the ambient 206, the cooling rate of the substrate 201 may be controlled on the basis of the criteria as previously explained with reference to FIG. 1d. Moreover, the arrangement shown in FIG. 2d, i.e., with the gas inlet 254 at the bottom of the stack 210 and the outlet 255 provided on top thereof, may provide a uniform flow rate through the stack 210 and also a well-defined cooling rate so that each of the substrates 201 may experience substantially the same flow conditions of the oxygen-containing gas. In other illustrative embodiments, the gas supplied for establishing the oxidizing ambient 206 may comprise oxygen and any appropriate inert gas, such as nitrogen, argon, helium or any combination thereof, wherein the cooling rate may also be controlled on the basis of the combination of the one or more inert gases and the oxygen. Moreover, the contents of oxygen may be varied between approximately 5 volume % to 25 volume %, which may therefore control the reaction speed for oxidizing the solder material. For example, if a desired progression of the cooling rate is adjusted by determining a specified flow rate, for instance on the basis of oxygen and nitrogen, the oxygen contents may be varied, for instance by providing a reduced oxygen amount at an initial phase so as to slow down the oxidation process, while increasing the oxygen contents at a later phase, when, for instance, a higher degree of temperature uniformity is established within the stack 210. It should be appreciated, however, that other control regimes with appropriate process parameters with respect to flow rate, gas composition and the like may be readily established on the basis of test runs, wherein a thickness and uniformity of a corresponding oxide layer may be correlated to corresponding process parameters.

In one illustrative embodiment, the substrate 201 may not be handled or otherwise processed unless the temperature is at approximately 50° C. and less, thereby reducing any oxidation non-uniformities that may take place even at these low temperatures. Thus, in this embodiment, after achieving a temperature of approximately 50° C. or less, the substrate 201 may be unloaded from the system 250 and may be subjected to further processing, such as dicing the substrate 210 in order to obtain separate semiconductor dies, which may then be attached to respective carrier substrates by connecting the resulting solder balls with respective solder pads on the carrier substrate.

As a result, the present invention provides an enhanced technique for the formation of solder balls by controlling the reflow and the oxidation process, wherein an increased temperature for the oxidation process may provide enhanced process control and thickness uniformity. Additionally or alternatively, the cooling rate during the oxidizing process may be controlled to remain within the range of approximately 10-25° C. per minute, thereby also contributing to the overall process uniformity. In some illustrative embodiments, the temperature during the oxidation, which in some embodiments is a venting process on the basis of ambient air, in combination with the well-defined cooling rate, provide for the formation of a thin yet stable oxide layer on the solder balls. Consequently, the resulting oxide layer may protect the solder balls during further processing but may be readily removed with flux material in a flip chip assembly process prior to the attachment of the respective semiconductor die to a package. Thus, yield loss as a result of functional failures during the assembly process may be significantly reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a plurality of lead and tin-containing solder bumps above a substrate, the solder bumps having a non-spherical upper surface;
   forming liquid solder balls by reflowing the plurality of solder bumps in an inert ambient comprising at least one of hydrogen and a hydrogen/nitrogen mixture by heating said solder bumps above a melting temperature of said solder bumps; and
   cooling said liquid solder balls at least initially in said inert ambient to form solid solder balls and exposing said solder balls to ambient air during said cooling when a temperature of said substrate is between approximately 190-250° C.

2. The method of claim 1, further comprising controlling a cooling rate of a cooling period for said substrate during exposure to ambient air to a range of approximately 10-25° C. per minute for at least a portion of said cooling period.

3. The method of claim 1, wherein said inert ambient is a hydrogen ambient.

4. The method of claim 3, further comprising purging said substrate in a nitrogen ambient prior to reflowing said solder bumps.

5. The method of claim 4, further comprising controlling an oxygen content in said inert ambient to be less than approximately 10 ppm prior to and during said reflowing of said solder bumps.

6. The method of claim 1, further comprising purging said substrate with nitrogen prior to exposing said substrate to ambient air.

7. The method of claim 1, wherein a plurality of substrates, including said substrate, are commonly processed, at least some of said plurality of substrates each comprising a plurality of solder bumps to be formed into respective solder balls.

8. The method of claim 7, wherein said plurality of substrates is arranged as a substantially vertical stack with predefined equidistant spaces between adjacent substrates.

9. The method of claim 8, wherein a predefined number of substrates is provided to form said vertical layer stack.

10. The method of claim 9, further comprising using one or more place holder substrates for said vertical stack when said predefined number of substrates having said plurality of solder bumps is not available.

11. The method of claim 1, wherein said inert ambient is a formic gas ambient.

12. The method of claim 7, wherein said plurality of substrates are substantially horizontally arranged.

13. The method of claim 2, wherein said portion of the cooling period is defined by a temperature of approximately 50° C. and less.

14. A method, comprising:
   forming a plurality of lead and tin containing solder bumps above a substrate, the solder bumps having a non-spherical upper surface;
   forming liquid solder balls by reflowing the plurality of solder bumps in an inert ambient comprising at least one of hydrogen and a hydrogen/nitrogen mixture by heating said solder bumps above a melting temperature of said solder bumps; and
   cooling said liquid solder balls at least initially in said inert ambient to form solid solder balls and exposing said solder balls to ambient air during said cooling while controlling a cooling rate of said substrate during a portion of a cooling period to be in a range from approximately 10-25° C. per minute.

15. The method of claim 14, wherein exposing said solder balls to ambient air is initiated when a temperature of said substrate is approximately 250° C. and less.

16. The method of claim 15, wherein exposing said solder balls to ambient air is initiated when a temperature of said substrate is above approximately 190° C.

17. The method of claim 14, further comprising controlling an oxygen content in said inert ambient to be less than approximately 10 ppm prior to and during said reflowing of said solder bumps.

18. The method of claim 14, wherein a plurality of substrates, including said substrate, are commonly processed, at least some of said plurality of substrates each comprising a plurality of solder bumps to be formed into respective solder balls.

19. The method of claim 18, wherein said plurality of substrates is arranged as a substantially vertical stack with predefined spaces between adjacent substrates.

20. The method of claim 14, wherein said portion of the cooling period is defined by a temperature interval from approximately 250° C. to approximately 50° C.

21. A method, comprising:
   forming a plurality of solder bumps above a substrate;
   forming solder balls by reflowing the plurality of solder bumps in an inert ambient comprising at least one of hydrogen and a hydrogen/nitrogen mixture by heating said solder bumps above a melting temperature of said solder bumps; and
   exposing said solder balls to an oxidizing ambient when a temperature of said substrate is between approximately 190-250° C. while controlling a cooling rate of said substrate to be in a range from approximately 10-25° C. per minute.

22. The method of claim 21, wherein said oxidizing ambient is substantially comprised of oxygen and nitrogen.

23. The method of claim 21, further comprising controlling an oxygen content in said inert ambient to be less than approximately 10 ppm prior to and during said reflowing of said solder bumps.

24. The method of claim 21, further comprising releasing said substrate for further handling and manufacturing processes when a temperature thereof is approximately 50° C. and less.

* * * * *